(12) United States Patent
Tong et al.

(10) Patent No.: US 8,471,234 B2
(45) Date of Patent: Jun. 25, 2013

(54) MULTILAYER MEMRISTIVE DEVICES

(75) Inventors: William M. Tong, San Francisco, CA (US); Nathaniel J. Quitoriano, Pacifica, CA (US); Duncan Stewart, Ottawa (CA); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 101 days.

(21) Appl. No.: 13/130,815

(22) PCT Filed: Jan. 20, 2009

(86) PCT No.: PCT/US2009/031458
§ 371 (c)(1),
(2), (4) Date: May 24, 2011

(87) PCT Pub. No.: WO2010/085241
PCT Pub. Date: Jul. 29, 2010

(65) Prior Publication Data
US 2011/0248381 A1    Oct. 13, 2011

(51) Int. Cl.
*H01L 47/00*    (2006.01)
(52) U.S. Cl.
USPC ............. 257/4; 257/1; 257/E21.006; 438/385

(58) Field of Classification Search
USPC ... 257/537, E29.325, 1, 4, E21.006; 438/382, 438/385
See application file for complete search history.

(56) References Cited

U.S. PATENT DOCUMENTS

| | | |
|---|---|---|
| 7,203,789 B2 | 4/2007 | Snider |
| 2008/0079029 A1 | 4/2008 | Williams |
| 2008/0090337 A1 | 4/2008 | Williams |

OTHER PUBLICATIONS

Sakamoto, Toshitsugu et al., "Three Terminal Solid-Electrolyte Nanometer Switch", Electron Devices Meeting, 2005, IEDM Technical Digest. IEEE International, Dec. 2005; 475-478; IEEE; USA.
Sakamoto, Toshitsugu et al., "NanoBridge Technology for Reconfigurable LSI", NEC Technical Journal; 2007, 72-75; vol. 2; No. 1.

*Primary Examiner* — Julio J Maldonado
*Assistant Examiner* — Amar Movva

(57) ABSTRACT

A multilayer memristive device includes a first electrode; a second electrode; a first memristive region and a second memristive region which created by directional ion implantation of dopant ions and are interposed between the first electrode and the second electrode; and mobile dopants which move within the first memristive region and the second memristive region in response to an applied electrical field.

15 Claims, 6 Drawing Sheets

MULTILAYER MEMRISTIVE DEVICES

BACKGROUND

The presence of dopants within an insulating or semiconducting matrix can dramatically increase the electrical conductivity of the matrix. In some devices, these dopants move within the matrix in response to a programming electrical field. This dopant motion can dynamically alter electrical resistance of the matrix and influence the electrical operation of an associated electrical device. After removal of the programming electrical field, the location and characteristics of the dopants remain stable until the application of another programming electrical field. The dopants can be used as a "memory" of past electrical fields which were applied to the matrix.

Electrical devices that exhibit this "memory" of past electrical conditions through dopant based changes in electrical resistance have been called "memristors" or "memristive devices." Memristive behavior is most strongly evident in nanometer scale devices and could potentially be used for high density data storage, circuit calibration, or to model biological processes such as nerve synapses. To more closely approximate complex interactions, it can be desirable for memristive devices to have multiple state variables which are at least partially decoupled.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1A:
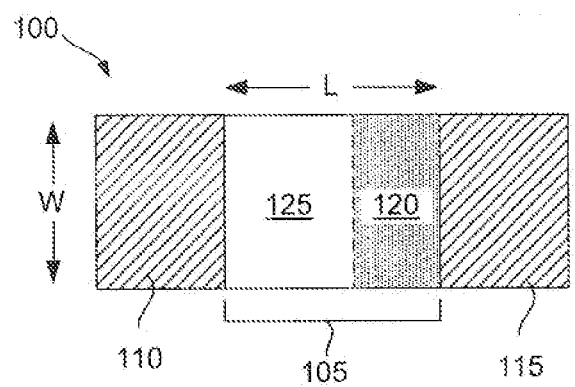
FIGS. 1A-1D are diagrams which illustrate basic operating principles of a memristive device, according to one embodiment of principles described herein.

The presence of dopants within an insulating or semiconducting matrix can dramatically increase the electrical conductivity of the matrix. Throughout the specification and appended claims the term "memristor" or "memristive" is used to describe a matrix/dopant combination which exhibits dopant motion in the presence of a programming electrical field and long-term dopant stability within the matrix when the programming field is removed. This memristive effect is most strongly evident in nanometer scale devices and allows the device to "remember" past electrical conditions.

There is a long felt but unfulfilled need for memristive components which retain a memory of past conditions. For example, basic memristive devices could be used to store data, switch signals, calibrate circuits, and for self-programming. These basic memristive devices typically include a memristive matrix which is in contact with several electrodes. The memristive matrix contains mobile dopants which move in response to an applied programming field but exhibit long term stability when the programming field is removed. An example of an electrical component which uses basic memristive devices may be a solid state memory device with high storage density, no power requirement for long term data retention, and fast access times. In some more complex applications, such as neuronal computing devices which share fundamental functionalities with the human brain, more sophisticated memristive devices could better perform the desired task. For example, a memristive device may provide a variety of state variables which have varying levels of influence over the final state of the device. These state variables could be created using a memristive matrix which is divided into multiple regions, each region have unique characteristics and influencing dopant motion in a different way. Multiple dopant species could then be introduced into the memristive matrix. The result is a more capable and flexible memristive device which could provide an electronic system with the ability to learn over time, apply fuzzy logic in hardware, and create hardware-based neural networks.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

The most basic memristive device may be a programmable resistor or "memristor." A memristor is the fourth fundamental circuit element, joining the capacitor, resistor, and inductor. The term "memristor" is derived from the combination of the two terms "memory" and "resistor." The memristor has properties that cannot be duplicated by the combination of the other fundamental circuit elements. Unlike the other fundamental circuit elements, the memristor carries a memory of past electrical fields which have been applied. As described in U.S. Patent App. Pub. No. 20080079029, entitled "Multi-terminal Electrically Actuated Switch" to R. Stanley Williams, which is hereby incorporated in its entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor to "remember" how much voltage was previously applied and for how long. The motion of these dopants alters the electrical resistance of the memristor. The dopants remain in this displaced state over long periods of time, thereby retaining a memory of the past electrical fields applied to the device. Until another electrical field is applied to the memristor which has sufficient intensity or duration to induce dopant motion, the resistance characteristics of the memristor are stable.

FIG. 1A shows an illustrative two-terminal memristive switch (100). According to one embodiment, the two-terminal memristive switch (100) is comprised of a first electrode (110) and a second electrode (115) which are in electrical and physical contact with the memristive matrix (105). Throughout the specification and appended claims, the term "memristive matrix" describes a thin film of a material that is electronically semiconducting or nominally electronically insulating and also a weakly ionic conductor. The memristive matrix is capable of transporting and hosting ions that act as dopants to control the flow of electrons and/or holes through the switch. The basic mode of operation is to apply an electrical field (the drift field, which may exceed some threshold for enabling the motion of the ions in the primary material) across the switch large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature and without an electric drift field above the critical field needed for programming. This ensures that the switch is nonvolatile, that is, that it holds its state after the drift field has been removed.

According to one embodiment, the memristive matrix (105) is made up of two portions: an intrinsic (not intentionally doped) portion (125) and a doped portion (120). Migration of the dopants from the doped portion (120) converts the intrinsic portion (125) into the doped portion (120) and increases the overall electrical conductivity of the device. Illustrative examples of suitable memristive combinations are given in Table 1, below. The table lists compatible intrinsic materials, doped materials, and dopant species for each of the memristive combinations.

TABLE 1

Illustrative Examples of Compatible Memristive Combinations

| Intrinsic Material | Doped Material | Dopant Species |
|---|---|---|
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |

Applying a high voltage across the electrodes (110, 115) causes both electron current to flow and dopant motion through the matrix material, whereas at a low voltage bias the dopant motion is negligible, which allows the characteristics of the memristor to remain unchanged.

These dopants may be impurity atoms such as hydrogen or some other cation species, such as alkali or transition metals, which act as electron donors for the matrix material. Additionally or alternatively, the dopants may be anion vacancies, which act as donors within the matrix. It is also a possible to drive anionic species into the matrix material, which will become electron acceptors (or holes). The matrix material may be a thin film (generally less than 50 nm thick), and is in many cases nanocrystalline, nanoporous, or amorphous. In general, the mobility of the dopant species can be much higher in nanostructured materials than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid over short distances. Another advantage of nanometer scale memristive devices is that a large electrical field can be produced by a relatively small applied voltage. For example, a dopant may require an electrical field intensity of 100,000 volts per centimeter to move within the matrix. If the distance between two electrodes is 100 nanometers, a voltage bias of only 1 Volt will produce the required electrical field intensity. The drift rate of dopants typically increases as the temperature of the memristive device increases. Consequently, the effect of an applied electrical field could be enhanced by heating the memristive device.

As noted above, the matrix material has certain properties that are useful in the practice of the present invention. One of these properties of the material is that it is a weakly ionic conductor. The definition of a weakly ionic conductor is based on the application for which a memristive device is designed. The mobility and the diffusion constant for a species in a lattice are directly proportional to one another, via the "Einstein relation". Thus, if the mobility of ionized species in a lattice is very high, so is the diffusion constant. In general, it is desired for a memristive device to stay in a particular state, such as a programmed configuration, for an amount of time that may range from a fraction of a second to years, depending on the application. Thus, the diffusion constant for such a device is, in an embodiment, low enough to ensure the desired level of stability, to avoid inadvertently turning reconfiguring the device via ionized species diffusion, rather than by intentionally setting the state memristive device with a voltage pulse. Therefore, a "weakly ionic conductor" is one in which the ion mobility, and thus the diffusion constant, is small enough to ensure the stability of the device configuration for as long as necessary under the desired conditions (e.g., the device does not change state because of diffusion of the dopants). "Strongly ionic conductors" would have large ionized species mobilities and thus would not be stable against diffusion.

As discussed above, the memristive matrix (105) may be initially comprised of two separate portions, an intrinsic portion (125) and a doped portion (120). The intrinsic portion (125) has very few dopants and prevents electrical current from flowing between the two electrodes (110, 115). The second doped portion (120) is conductive and also serves as a source of dopants which can be moved into the intrinsic portion (125) to change the overall electrical conductivity of the memristive matrix (105). Consequently, in the configuration illustrated in FIG. 1A the memristive switch (100) is open.

According to one illustrative embodiment, the intrinsic portion (125) is comprised of intrinsic titanium dioxide ($TiO_2$). Intrinsic titanium dioxide ($TiO_2$) is an insulator, having a resistivity of approximately $10^{12}$ ohm centimeter at 25° C. The second highly doped layer (120) is comprised of oxygen deficient titanium dioxide ($TiO_{2-x}$), where the subscript "x" indicates that the titanium dioxide has a small deficit of oxygen atoms in the crystal structure. These positively charged oxygen vacancies are the dopants in this embodiment. Even relatively low concentrations of oxygen vacancies (below 2%) result in a large increase of the electrical conductivity within the titanium dioxide. The oxygen vacancies act as electron donors, thus $TiO_{2-x}$ is an n-type semiconductor. Additionally, the oxygen vacancies move within the titanium dioxide under the influence of electrical fields. For example, electrical fields between 10,000 volts per centimeter and 100,000 volts per centimeter may be sufficient to physically relocate the oxygen vacancies.

The memristive matrix (105) has a length of "L" and a width of "W" as shown in FIG. 1A. For purposes of illustration only, assume that the length "L" is 100 nanometers and the width "W" is approximately 50 nanometers. Consequently, to apply an electrical field of 100,000 volts/centimeter across the memristive material (105), a voltage bias of 1 volt could be applied across the electrodes (110, 115).

The dopants may originate from a variety of sources. The matrix material may be initially formed with a number of dopants distributed throughout the matrix. A programming electrical field can then be used to displace the dopant to form intrinsic regions and doped regions within the matrix. In other embodiments, the matrix material may be deposited in its intrinsic form. A sacrificial layer is then deposited onto the intrinsic material which provides the dopants by chemically reacting with the intrinsic matrix. For example, a layer of intrinsic titanium dioxide may be deposited, followed by a layer of aluminum. The elemental aluminum has a high affinity for oxygen molecules and will chemically combine with a number of oxygen molecules which were previously bound within the titanium dioxide matrix, thereby creating aluminum oxide. This creates oxygen vacancies within the titanium dioxide matrix. The oxygen vacancies then act as dopants within the titanium dioxide matrix. The aluminum/aluminum oxide layer can be then be striped from the matrix. In other embodiments, the aluminum may remain within the memristive device or be used as an electrode.

In an alternative embodiment, the initial doping may be accomplished by directly depositing the doped secondary material (120) during the manufacturing process. The application of a programming electrical field to the memristive device then allows the dopants contained within the secondary material (120) to be distributed as desired throughout the matrix.

Additionally, a passivation layer may be formed over a memristive device to prevent atmospheric oxygen or other contaminants from chemically altering the composition of the memristive device. For example, if a passivation layer is not present, an oxygen deficient titanium dioxide matrix may lose dopants over time as a result of atmospheric oxygen filling the oxygen vacancies.

The electrodes (110, 115) may be constructed from a variety of conducting materials, including but not limited to: metals, metal alloys, highly doped semiconductors, composite materials, nanostructured materials, or other suitable materials. According to one illustrative embodiment, the electrodes are formed from platinum.

Figure 1B:
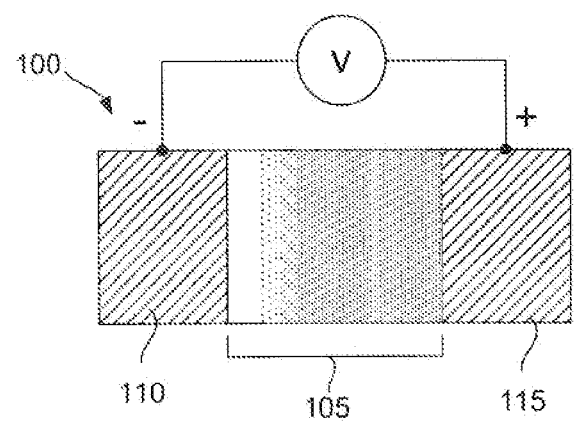

FIG. 1B illustrates the movement of positively charged dopants from the highly doped secondary region (120) into the intrinsic primary region (125) as a result of an applied electrical field. The polarity and voltage difference which is applied across the memristive matrix (105) may vary according to a variety of factors including, but not limited to: material properties, geometry, dopant species, temperature, and other factors. Where titanium dioxide is used as the matrix, the oxygen vacancies have a positive charge, consequently a positive voltage is applied to the right electrode (115) to repulse the oxygen vacancies and drive them toward the left electrode (110).

Figure 1C:
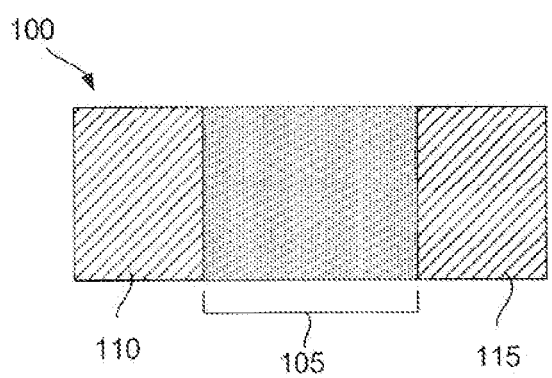

FIG. 1C illustrates the memristive switch in the fully "ON" position, with the dopants fully distributed throughout the memristive matrix (105). In some embodiments, the dopant may diffuse fairly uniformly at first; but, when bridging the final gap between two electrodes to form a conducting channel, the dopants may form small filaments. These small filaments provide the final connection between the electrode (110) and the doped region (120). The left and right electrodes (110, 115) are then electrically connected and can pass lower voltage electrical signals through the memristive matrix (105). As discussed above, the location and distribution of the dopants can remain stable over long periods of time or until another programming voltage is applied. The memristive matrix (105) is not a perfect conductor and still interposes an electrical resistance between the two electrodes (110, 115) in the fully "ON" state. This electrical resistance may be influenced by a variety of factors, including, but not limited to the geometry of the memristive matrix and the electrodes, the dopant concentration, the distribution of the dopants throughout the memristive matrix, the species of dopant, the electrical characteristics of the matrix material, the temperature of the device, and other factors.

Figure 1D:
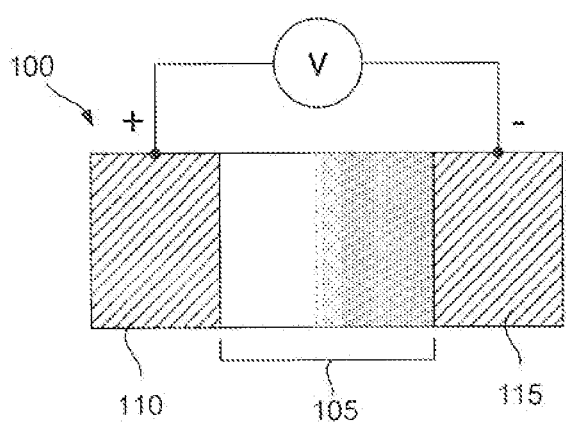

FIG. 1D illustrates the application of another programming voltage to the memristive switch (100). In this case, the purpose of the programming voltage is to return the memristive switch (100) to the fully "OFF" configuration similar to that illustrated in FIG. 1A. Consequently, the applied programming voltage has an opposite polarity from that illustrated in FIG. 1B. A positive voltage is applied to the left electrode (110) and negative voltage is applied to the right electrode (115), thereby driving the dopants to toward the right electrode (115). This returns the left most portion of the memristive matrix (105) to its intrinsic and insulating state. The memristive switch (100) is then in a fully "OFF" configuration.

The transition from the fully "OFF" to fully "ON" configuration or visa versa, is not instantaneous, but can have a number of intermediate states in which the memristive matrix acts as a finite resistance between the two electrodes. These intermediate states may be produced by varying the programming voltage applied across the two electrodes (110, 115) and/or varying the time period during which the programming voltage is applied.

It may be desirable to for memristive device to exhibit a more complex response to external stimulus. For example, if a memristive device is intended to simulate chemical synapses, which provide the basis for perception and thought in biological organisms, it may be desirable for the memristive device to have more than state variable. By including more than one state variable, the memristive device can more closely simulate higher level synaptic functions such as desensitization, homosynaptic or hetrosynaptic plasticity, integration of synaptic inputs, pharmacological intervention, and other functions. These additional state variables may be created within a memristive device by including more than one dopant species within the memristive matrix, by including more than one type of memristive matrix in a memristive device, creating multiple electrodes which contact the memristive matrix, or through other methods.

Figure 2:
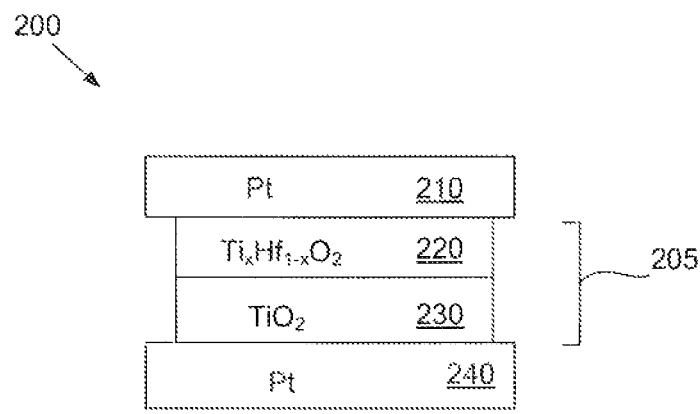
FIG. 2 is a diagram of an illustrative multilayer memristive device, according to one embodiment of principles described herein.

FIG. 2 illustrates a multilayer memristive device (200) which incorporates a bi-layer junction (205) sandwiched between an upper electrode (210) and a lower electrode (240). A number of matrix materials could be used to form the bi-layer junction. In this illustrative embodiment, an upper layer of titanium hafnium oxide ($Ti_xHf_{1-x}O_2$) and a lower layer of titanium dioxide ($TiO_2$) make up the bi-layer junction (205). One or more of dopant species could be present in the bi-layer junction (205). By way of example and not limitation, the dopants species could include oxygen vacancies, beryllium ions, potassium ions, sodium ions, or other suitable dopants. These dopants may have the ability to pass between the two layers (220, 230), but may exhibit significantly different behavior within the different matrix materials. For example, a dopant may move relatively easily within a first material, but may require a significantly higher electrical field to move within a second field. Additionally, the dopant drift rate and dopant density may be different in the two materials. For example, the drift rate of oxygen vacancies in titanium dioxide may be significantly higher or lower than in titanium hafnium oxide. These differences can be leveraged to produce a more complex response to applied voltages. For example, if a dopant species within a first layer requires only a low electrical field for motion but a higher electrical field for motion in a second layer, the dopants can be moved within the first layer without affecting the dopants in the second layer.

The electrical resistances created and modulated within the upper layer (220) and the lower layer (230) can be thought of as resistors in series. The entire flow of electricity from the upper electrode (210) to the lower electrode (240) must pass through the upper layer (220) and then through the lower layer (230). Consequently, the total resistance of the junction (205) could be closely approximated by adding the resistance of the upper layer (220) and the lower layer (230).

Figure 3:
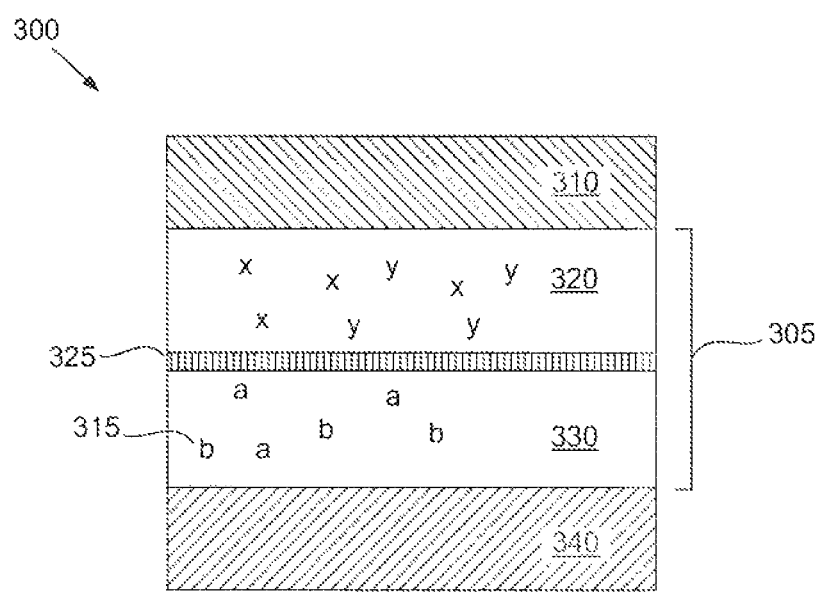
FIG. 3 is a diagram of an illustrative multilayer memristive device containing more than one dopant species, according to one embodiment of principles described herein.

FIG. 3 shows a memristive device (300) which incorporates a more complex junction (305) between two opposing electrodes (310, 340). The junction (305) includes an upper memristive layer (320) and a lower memristive layer (330) which are separated by an intermediate layer (325). The intermediate layer (325) may have a number of characteristics, including but not limited to, selective permeability. A selective permeable layer is a layer through which one dopant species may pass, but another dopant species cannot. For example, the intermediate layer (325) may be made up of a zeolite material. Zeolite is a natural or synthetic material which has a microporous structure with pores on the order of two nanometers in diameter. The pores within the zeolite structure may be primarily in the form of open cylinders which extend significant distances through the structure or, more often, form a more contorted pathway through the structure. This microporous structure may allow a particular dopant to pass through the pores but significantly retard the motion of a different dopant species. This selective permeability may be influenced by a number of factors, included, but not limited to the pore size, the pathway through the structure, the thickness of the structure, other dopants present within the structure, electrical or chemical interactions between the structure and dopant, or other factors.

In addition to zeolite, the intermediate layer (325) may be constructed from a variety of materials, including but not limited to nanotubes, porous titanium dioxide, porous silica, porous carbon, porous alumina or a nonporous material which exhibits different diffusion constants for various dopant species. Each of these materials could form multiple microporous pathways between two matrix layers (320, 330). According to one illustrative embodiment, carbon nanotube and/or inorganic nanotubes may be used as the intermediate layer (325). Carbon nanotubes are allotropes of carbon that belong to the fullerene structural family. Carbon nanotubes typically have a diameter on the order of a few nanometers and a length that is many times the diameter. An array or bundle of carbon nanotubes could be formed with the major axis of the tubes oriented in the desired direction of dopant motion. The dopants could then pass through the carbon nanotubes and into the memristive matrix in a controlled and uniform fashion. Carbon nanotubes typically have high electrical conductivities along their length. In circumstances where an intermediate layer (325) with high electrical conductivity is important, carbon nanotubes could be used to provide an electrically conductive microporous layer.

Inorganic nanotubes could also be used within the intermediate layer (325). Inorganic nanotubes are often composed of metal oxides and are morphologically similar to a carbon nanotube. By way of example and not limitation, these inorganic nanotubes could potentially be formed from tungsten disulfide, vanadium oxide, manganese oxide, boron nitride, copper, bismuth, silicon, titanium dioxide and other materials.

In many of the embodiments, it may be desirable to include dopants within the structure of the intermediate layer (325) or contained within the pores of the intermediate layer (325). When dopants are included in the structure of the intermediate layer (325), they can both influence the form of the structure and increase its electrical conductivity. When dopants are contained within pores of the intermediate structure (325), the intermediate structure (325) may serve as a reservoir for dopants and a convenient method for evenly dispersing a precise amount of dopant throughout the junction (305).

In addition to porous materials, the intermediate layer (325) may be made up of a variety of thin films. For example, a thin film of silicon could serve as an intermediate layer (325). The silicon could be appropriately doped to achieve the desired level of electrical conductivity. According to one illustrative embodiment, one or more dopant species could be selected which are compatible with both silicon and the matrix material. These dopants could pass through the silicon intermediate layer (325) while other dopants which are not capable of passing through the silicon intermediate layer (325) would be prevent from moving from one matrix layer to another.

In FIG. 3, there are a number of dopant species (315) illustrated in the upper matrix layer (320) and lower matrix layer (330). A number of representative dopant ions are illustrated as letters within the matrix area. Dopant species "a" and "b" are initially located in the lower matrix layer (330) and dopant species "x" and "y" are initially located in the upper matrix layer (320). As discussed above, the intermediate layer (325) may selectively allow one or more species to pass through it and into the other matrix layer. For example, species "a" may be permitted to pass through the intermediate layer (325), while species "b" may be prevented from passing through the intermediate layer (325). Similarly, the intermediate layer (325) may permit one of the dopant species "x" and "y" to pass through into the lower layer (330) while retaining the other species in the upper layer (320).

In one illustrative embodiment, the upper and lower matrix layers (320, 330) of the matrix may be titanium dioxide and the intermediate layer (325) may be an electrically conductive zeolite. The dopant species "x" may be oxygen vacancies and the dopant species "y" may be potassium ions. The potassium ions may have ability to pass through the intermediate layer by exiting the upper titanium dioxide matrix (320), passing through the intermediate layer, and entering the lower titanium dioxide matrix (330). In contrast, the oxygen vacancy dopants will be unable to leave the upper titanium matrix. As discussed above, an oxygen vacancy results from an absence of an oxygen atom from a titanium dioxide molecule. Ordinarily, titanium dioxide has one titanium atom that is chemically bonded to two oxygen molecules. By removing one of the oxygen molecules, an oxygen vacancy is created. Because of the nature of the oxygen vacancies, they cannot pass through the intermediate layer (325) and remain trapped on one side of the intermediate layer (325).

The memristive device (300) illustrated in FIG. 3 may be particularly useful as an analogue to a biological synapse. For example, the upper electrode (310) could be analogous to an axon which carries an electrical impulse to a synapse. The upper matrix (320) could represent the axon terminal and the dopant species (315) within the matrix (320, 330) could represent various neurotransmitters. The intermediate layer (325) could be an analogue to the synaptic cleft in a chemical synapse. The lower matrix (330) would then represent the dendritic spine, with the lower electrode (340) representing the electrical connection between the dendritic spine and its associated neuron. The memristive device (300) could exhibit behavior which simulates the various sodium, calcium, and potassium channels in a biological synapse. Additionally biological characteristics such as latency of channel opening, the electrical conductance of the ion pore, activation voltage, amplification, and activation duration could be simulated.

In one embodiment, the intermediate, layer (325) may be electrically charged, either by its composition or through the application of an external electrical field. This electrical charge may serve as a "gate" which prevents or allows the passage of one or more dopants species through the intermediate layer. For example, a porous intermediate layer may be charged with net positive electrical charge by an external voltage. This would repel positively charged dopant ions and could prevent their passage, while attracting negatively charged dopant ions into the porous intermediate layer (325). This could provide for additional control of the distribution of dopants and create a junction which exhibits more complex behavior typical of a nerve synapse. According to one illustrative embodiment, this mechanism could be used to simulate the controlled uptake of neurotransmitters in a biological synapse.

In some circumstances, it can be desirable for various matrix layers to be oriented vertically rather than horizontally. By orienting the matrix layers vertically, the resistances created and modulated by dopants within each matrix layer contribute to the overall resistance of junction in parallel manner rather than in series.

Figure 4A:
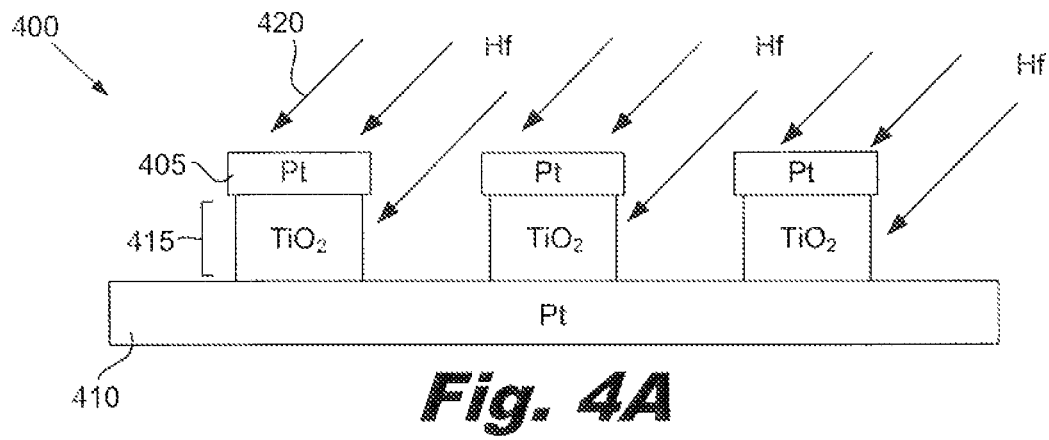
FIGS. 4A-4C are diagrams of an illustrative memristive array and steps in forming the memristor array, according to one embodiment of principles described herein.
Figure 4B:
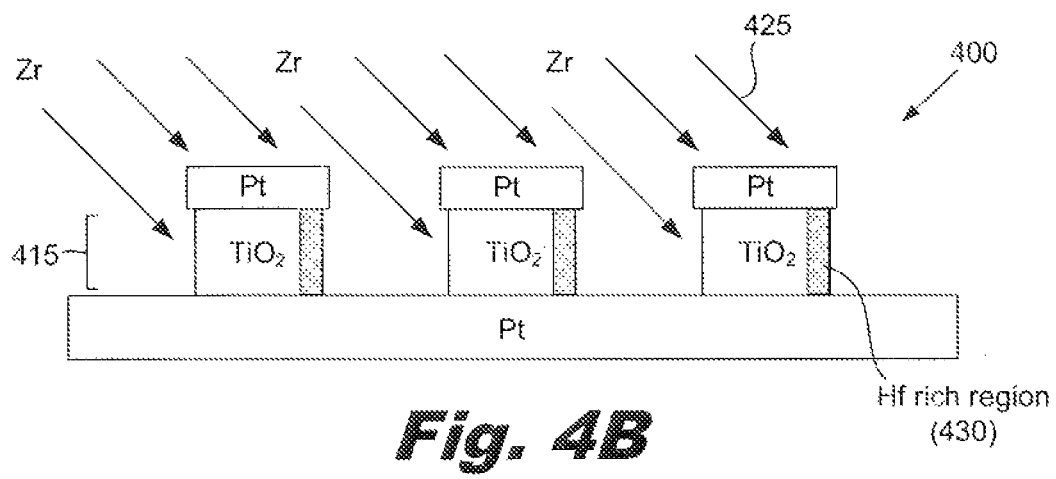
Figure 4C:
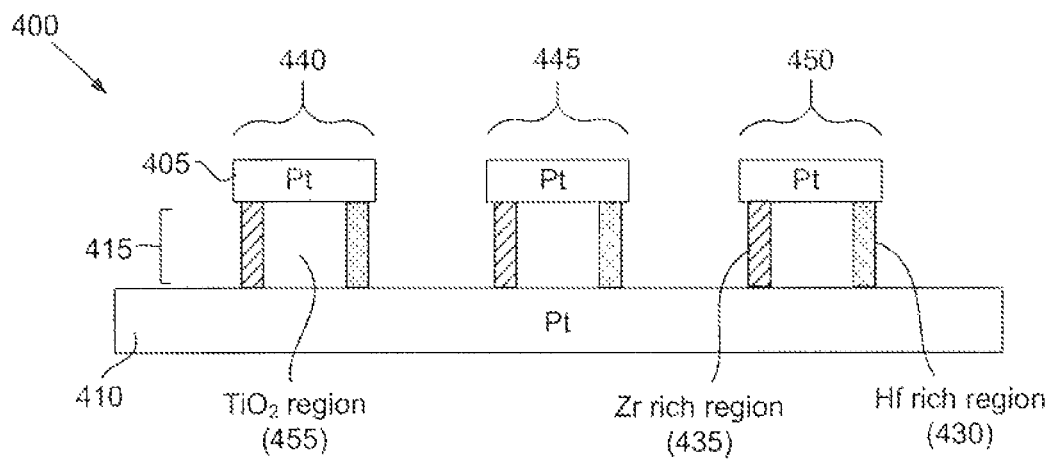

FIGS. 4A-4C show one illustrative method for creating an array of memristive devices (400) which have vertically oriented matrix layers. According to one illustrative embodiment shown in FIG. 4A, a lower platinum electrode (410) is formed. On top of the lower platinum electrode (410), a number of titanium dioxide islands are deposited which form the initial junctions (415). Above the junctions, upper platinum electrodes are formed (405). Following the creation of this initial structure, hafnium dopants (420) are directionally deposited such that the hafnium dopants diffuse into one vertical side of the titanium dioxide junction (415). According to one illustrative embodiment, the hafnium dopants may be selective deposited into the right side of the junction (415) using ion implantation. As shown in FIG. 4A, the ion implantation deposition technique uses the junction (415) and upper electrode (405) material to "shadow" the left side of the junction from the ion bombardment, thereby preventing the implantation of the hafnium ions (420) on the left side of the junction.

FIG. 4B shows the resulting hafnium rich region (430) which is formed from the right portion of each of the junction (415). According to one illustrative embodiment, a second dopant species is implanted on the opposite side of the titanium dioxide matrices in a similar manner. For example, zirconium ions (425) may be directionally deposited using ion implantation on the left side of the junction (415).

FIG. 4C shows a completed array of memristive devices (400) which are made up of three memristive devices (440, 445, 450). Each of the memristive devices (440, 445, 450) includes a hafnium rich region (430), a zirconium rich region (435) and a titanium dioxide central region (455). The hafnium rich region (430) may be represented as titanium hafnium oxide or chemical formula $Ti_xHf_{1-x}O_2$, where "x" represents the portion of titanium and "1-x" represents portion of hafnium within in the hafnium rich region. Theoretically, the subscript "x" could vary from a value of one for pure titanium dioxide to a value of zero for pure hafnium oxide. Similarly, ion deposited zirconium dopant may be represented as $Ti_xZn_{1-x}O_2$.

A variety of other manufacturing techniques could be used to form the three separate matrix regions (430, 435, 455) between the upper electrode and the lower electrode. By way of example and not limitation, deposition processes such as physical vapor deposition, chemical vapor deposition, electrochemical deposition, molecular beam epitaxy, and atomic layer deposition could be coupled with removal processes such as wet etching, dry etching, plasma ashing, chemical mechanical planarization, and other lithographic processes to form various layer and structures.

The three separate matrix regions (430, 435, 455) can form separate parallel resistances between the upper electrode (405) and the lower electrode (410). This multilayer structure essentially incorporates three parallel memristive devices or elements to produce a memristive device with multiple state variables. The three separate matrix regions minimize the interaction between the dopant species, making the state variables more independent. Consequently, the behavior of the device is more predictable and easier to model.

Figure 5:
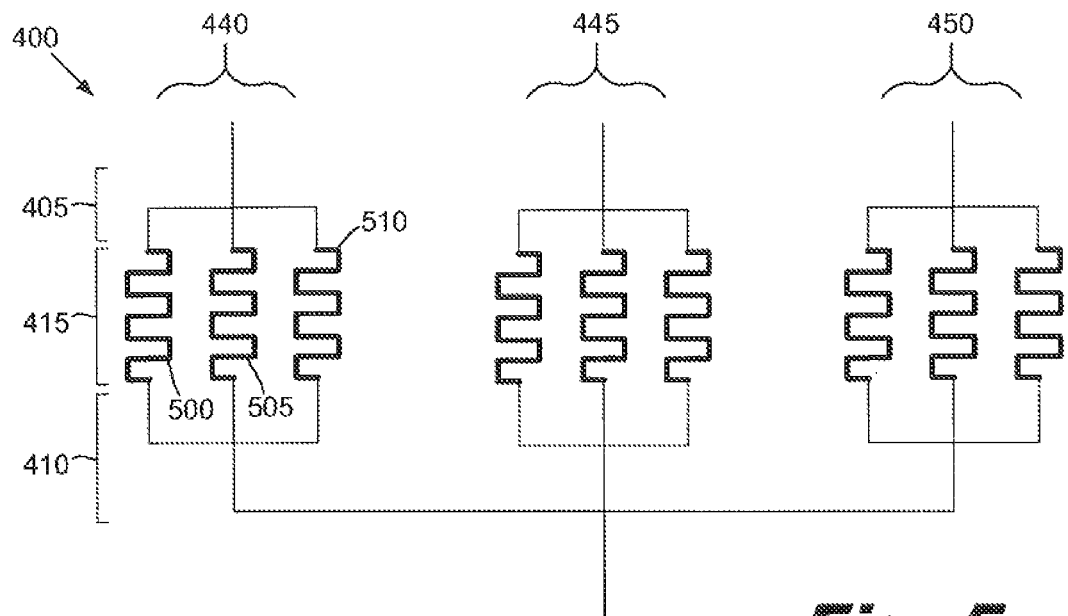
FIG. 5 is an electrical schematic of a plurality of interconnected multilayer memristive devices, according to one embodiment of principles described herein.

FIG. 5 is a schematic illustration of the one possible electrical configuration of the memristive array (400) described in FIGS. 4A-4C. The three memristive devices (440, 445, 450) are modeled with three parallel memristive elements (500, 505, 510) making up each memristive device. The upper electrodes (405) form the electrical connections at the top of the memristive devices and is represented as a series of connected lines. Similarly, the lower electrode (410) forms the electrical connections at the bottom of the memristive array and is represented as a single line which branches into nine connections, one at the base of each memristive element.

According to one illustrative embodiment, each of the three memristive elements (500, 505, 510) which make up a memristive device (440) may have different characteristics. By way of example and not limitation, a first memristive element (500) may be comprised of a titanium zirconium oxide matrix, a second memristive element (505) may be comprised of titanium dioxide matrix, and a third memristive matrix (510) may be comprised of a titanium hafnium oxide matrix. Each of the memristive elements (500, 505, 510) may have different material properties and compatible dopant species. For example, the three memristive elements (500, 505, 510) may contain have one or more mobile dopant species. The dopant species may be unique to a single memristive element or may be shared among all the elements. For example, oxygen vacancies may act as a shared dopant which is compatible with each of the memristive elements (500, 505, 510). According to one illustrative embodiment, the threshold voltage, the drift rate, and other characteristics of oxygen vacancies may be different within each of the memristive elements (500, 505, 510). Consequently, each of the memristive elements (500, 505, 510) can represent an independent electrical path between the upper electrode (405) and the lower electrode (410).

The resistances of the individual elements (500, 505, 510) within a memristive device (440) can be added as resistors in parallel according to the following equation:

$$\frac{1}{R_{total}} = \frac{1}{R_1} + \frac{1}{R_2} + \frac{1}{R_3} \qquad \text{Eq. 1}$$

where $R_{total}$ is the total resistance of the memristive device between two electrodes and $R_1$, $R_2$, and $R_3$ are the resistances of the three parallel memristive elements which make up the memristive device.

Figure 6:
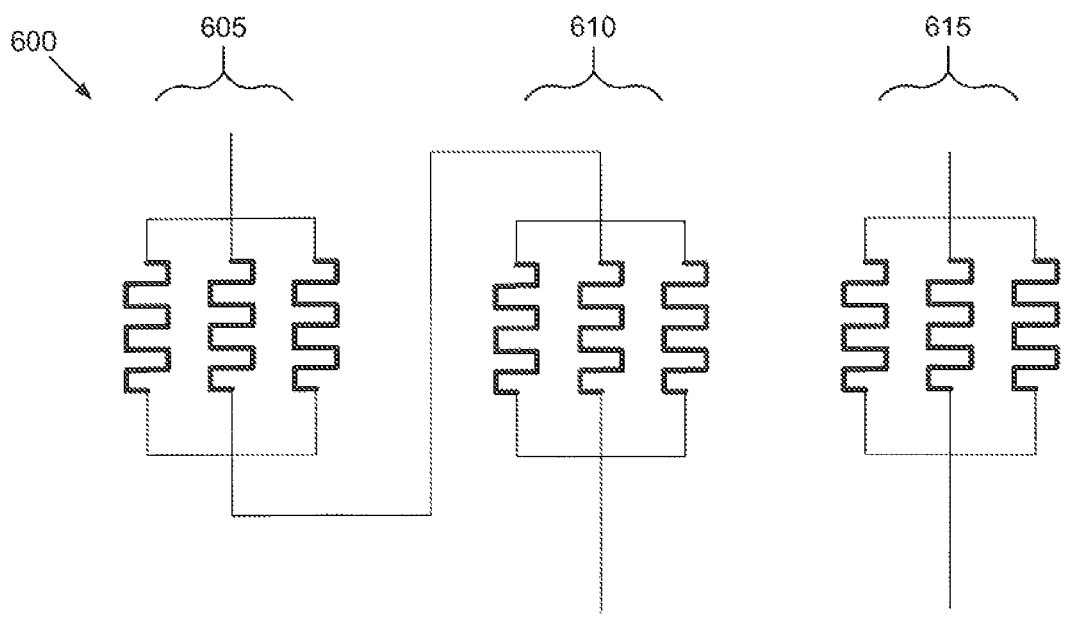
FIG. 6 is an electrical schematic of a plurality of interconnected multilayer memristive devices, according to one embodiment of principles described herein.

An array of memristive devices could be connected in a variety of ways to produce the desired configuration. FIG. 6 is a schematic diagram which shows an illustrative memristive array (600) which contains three memristive devices (605, 610, 615). Each memristive device (605, 610, 615) is made up of three memristive elements. Two of the memristive devices (605, 610) are wired in series and the third memristive device (615) is wired to act independently from the other memristive devices (605, 610).

Figure 7:
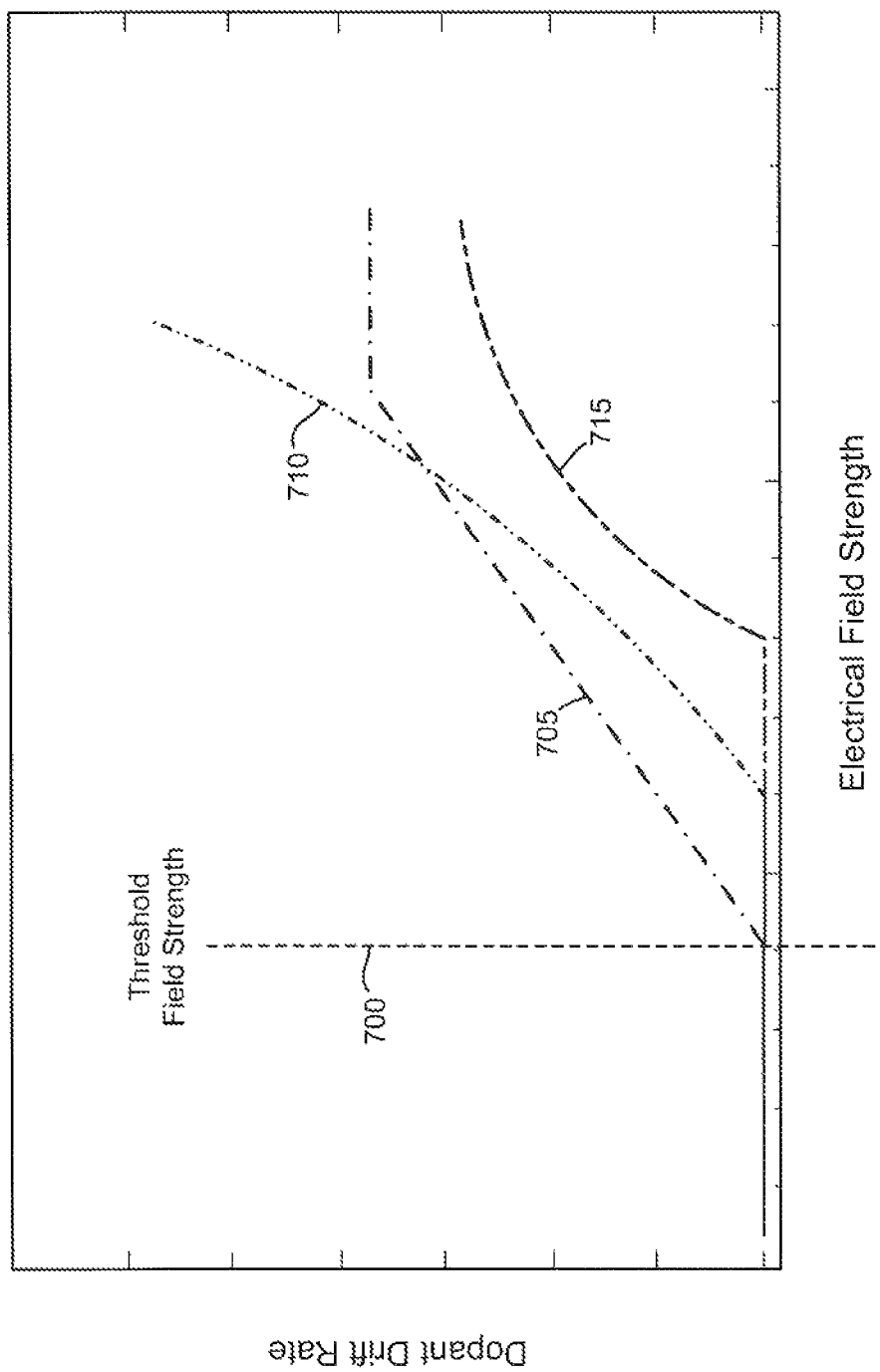
FIG. 7 is a chart illustrating different dopant drift rates within a multilayer memristive device, according to one embodiment of principles described herein.

FIG. 7 is graph which shows a potential variation of dopant drift rates in three different memristive materials. As mentioned above, there are a variety of other characteristics which may also be different between memristive elements. Dopant drift rates are used an illustrative example to show potential variations between various memristive elements.

The graph shows the variation in dopant rate of drift along its vertical axis, with lower dopant drifts rates at the bottom of the vertical axis and increasingly greater dopant drifts higher on the vertical axis. The horizontal axis represents the strength of the applied electrical field, with increasing field intensities shown farther right on the graph.

According to one illustrative embodiment, there is a threshold field strength (700) below which there is substantially no dopant motion. This lack of dopant motion is represented by a horizontal solid line which extends left from the dotted line.

Each of the memristive elements may have its own characteristic response to an applied electrical field. Each of the lines (705, 710, 715) to the right of the threshold field strength (700) represents an illustrative response of a memristive element to an applied electrical field. For example, a first memristive element may respond as illustrated by the dash-dot line (705). The dash-dot line (705) shows that the memristive element has dopant motion which begins when an electrical field just stronger than the threshold is applied to the first memristive matrix. The dopant drift of the dopant species contained within the first memristive element then increases linearly with as a function of the applied field strength until reaching a maximum rate of dopant drift. At the maximum rate of dopant drift for the first memristive element, increasing the intensity of the applied electrical field does not result in an increased rate of dopant drift.

A dot-dot-dash line (710) shows an illustrative response of a second memristive element to an applied electrical field. In the second memristive element, the dopant drift does not begin until the strength of the electrical field significantly exceeds the threshold field strength. After the dopants in the second memristive device begin to move, increasing the electrical field strength results in an exponential increase in the rate of dopant drift.

A dash-dash line (715) shows an illustrative response of a third memristive element to an applied electrical field. The dopants within the third memristive element require the highest strength electrical field to begin moving. The initially rate of dopant motion increases rapidly, but as stronger electrical fields are applied the dopant drift increases less rapidly.

Figure 8:
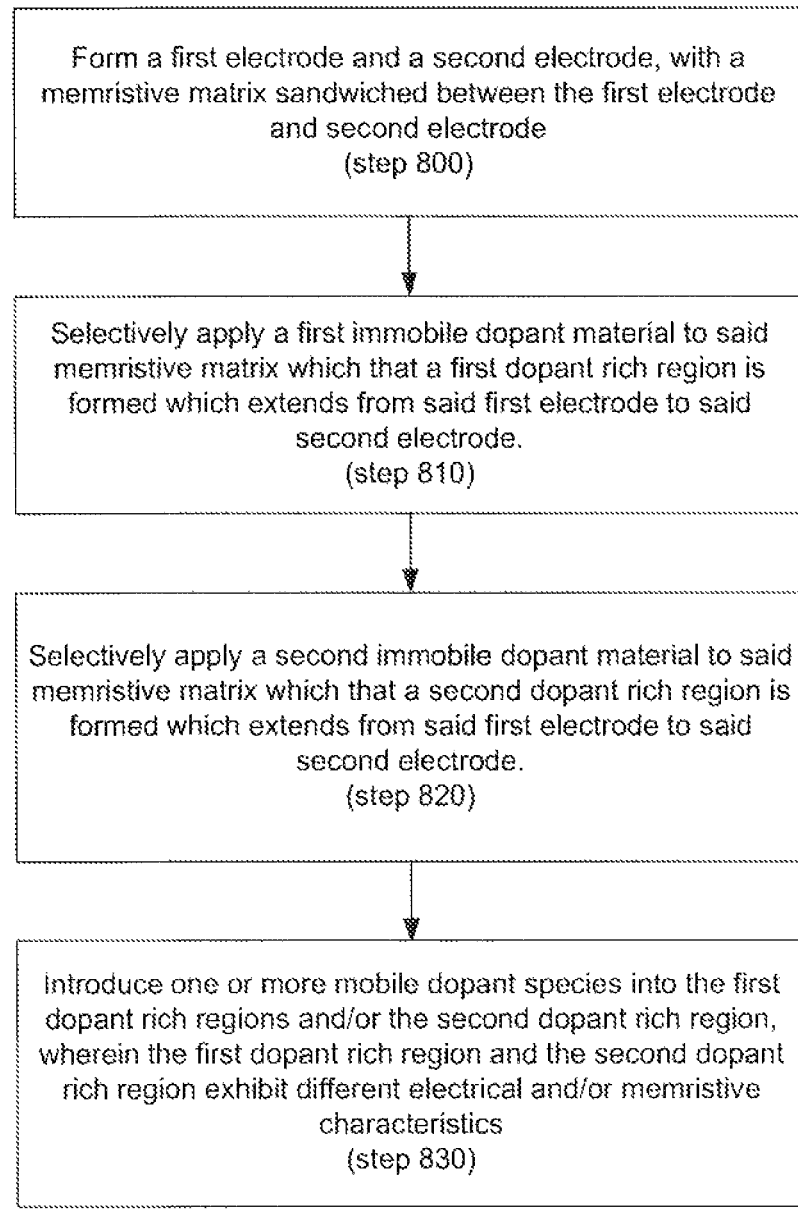
FIG. 8 is a flowchart showing one illustrative method for manufacturing a memristive array, according one embodiment of principles described herein.

FIG. 8 is a flowchart which describes one illustrative method for manufacturing a memristive device having multiple memristive elements. These multiple memristive elements extend between a first electrode and a second electrode. In a first step, a first electrode and a second electrode are formed with a memristive matrix sandwiched between the first and second electrode (step 800). The creation of desired electrical connections between various memristive elements and outside components could also be performed at this point.

A first immobile dopant material is selectively applied to the memristive matrix to form a first dopant rich region which extends from the first electrode to the second electrode (step 810). A second immobile dopant material is selectively applied to the memristive matrix to form a second dopant rich region which extends from the first electrode to the second electrode (step 820).

One or more mobile dopant species are then introduced into the first and second dopant rich regions (step 830). The first and second dopant rich regions exhibit one or more differences. These differences may include variations in electrical and/or memristive behavior.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A multilayer memristive device comprising:
    a first electrode;
    a second electrode;
    a first memristive region;
    a second memristive region, said first memristive region and said second memristive region being created by directional ion implantation of dopants into a memristive matrix; said first memristive region and said second memristive region being interposed between said first electrode and said second electrode; and
    mobile dopants; said mobile dopants moving within said first memristive region and said second memristive region in response to an applied electrical field.

2. The device of claim 1, wherein said first memristive region and said second memristive region form controllable electrical resistances between said first electrode and said second electrode, said controllable electrical resistances being in parallel.

3. The device of claim 1, wherein said first memristive region contacts said first electrode and said second electrode; said first memristive region forming a controllable pathway for a flow of electrical current between said first electrode and said second electrode.

4. The device of claim 3, wherein said second memristive region contacts said first electrode and said second electrode; said second memristive region forming a controllable pathway for a flow of electrical current between said first electrode and said second electrode.

5. The device of claim 1, wherein said mobile dopant exhibits a first diffusion performance in said first memristive region and a second diffusion performance in said second memristive region.

6. The device of claim 1, wherein said memristive matrix comprises titanium dioxide and said dopant species is a transition metal.

7. The device of claim 1, wherein said first memristive region is formed by directional ion implementation of a first dopant species and said second memristive region is formed by directional ion implementation of a second dopant species.

8. The device of claim 7, wherein said memristive matrix is titanium dioxide, said first dopant species is hafnium and said second dopant species is zirconium.

9. The device of claim 1, wherein portions of said memristive matrix not doped by said directional ion implantation form a third memristive region, said third memristive region forming a controllable pathway for flow of electrical current between said first electrode and said second electrode.

10. The device of claim 1, wherein memristive performance of said first memristive region differs from said second memristive layer region, wherein said memristive performance is at least one of: electrical field threshold for dopant motion and dopant drift rate.

11. The device of claim 1, wherein a plurality of said memristive devices are arranged in an array.

12. A memristive array comprising:
 a plurality of memristive devices, said each of said plurality of memristive devices comprising:
  a first electrode;
  a second electrode;
  three memristive regions interposed between said first electrode and said second electrode such that each of said three memristive regions contact said first electrode and said second electrode; each of said three memristive regions contain a mobile dopant and form a controllable parallel resistance between said first electrode and said second electrode; said each of said three memristive regions being configured to respond to an applied electrical field by altering said controllable parallel resistance in a manner that is unique among said three memristive regions.

13. A method for forming the memristive array of claim 12 comprising:
 forming an island of a memristive matrix material on a base electrode;
 forming an upper electrode on top of said island;
 implanting ions in a first side of said memristive matrix such that a first memristive region is formed; said first memristive region having a different memristive performance from said memristive matrix material;
 moving a mobile dopant within said first memristive region to alter a resistance between said upper electrode and said base electrode.

14. The method of claim 13, further comprising:
 forming a plurality of said islands of said memristive matrix on said base electrode;
 forming said upper electrode on each of said islands;
 implanting first ions using directional ion implantation on said first side of said islands such that said first memristive region is formed in each of said islands; and
 implanting second ions using directional ion implantation on a second side of said islands such that a second memristive region is formed.

15. The method of claim 14, further comprising:
 controlling implantation depth of said ions in said first side and said second side of said islands such that a center portion of said memristive matrix is not implanted with said ions.

* * * * *